United States Patent [19]
Matthews et al.

[11] Patent Number: 5,557,198
[45] Date of Patent: Sep. 17, 1996

[54] ONBOARD DIGITAL LOCOMOTIVE MULTIMETER

[75] Inventors: Jack W. Matthews, 1131 Wheaton Oaks Ct., Wheaton, Ill. 60187; William Stevens, Wheaton, Ill.

[73] Assignee: Jack W. Matthews, Wheaton, Ill.

[21] Appl. No.: 337,859

[22] Filed: Nov. 14, 1994

[51] Int. Cl.⁶ ............................. G01R 19/00; G01R 1/00; G01R 21/00
[52] U.S. Cl. ......................... 324/115; 324/142; 324/114
[58] Field of Search ............................. 324/114, 115, 324/142

[56] References Cited

U.S. PATENT DOCUMENTS

| | | | |
|---|---|---|---|
| 3,614,611 | 10/1971 | Benjamin | 324/114 |
| 4,758,962 | 7/1988 | Fernandes | 364/483 |

Primary Examiner—Kenneth A. Wieder
Assistant Examiner—Barry C. Bowser

[57] ABSTRACT

A digital, DC voltage meter device utilized for metering electric power on a locomotive system. This invention will eliminate the need to use a hand held meter to perform these functions. The meter is permanently built into the Voltage test panel, replacing test receptacles with a large ⁷⁄₁₀' LED display that can be read day or night. It is designed to operate in temperatures from −32 degrees Fahrenheit to 158 degrees Fahrenheit. A three position spring loaded switch returning to the off position is used to operate the meter. The present invention is a custom DC voltage meter that is capable of measuring two voltage ranges on a locomotive system; 0–1500 Volts ("V") for main generator voltage can be measured when the switch is in the top position; and 0–75 millivolts ("mV") for load test shunt millivoltage can be measured when the switch is in the bottom position. The meter is also capable of displaying the Dynamic Braking Voltage when the locomotive's dynamic brake is engaged.

17 Claims, 1 Drawing Sheet

ONBOARD DIGITAL LOCOMOTIVE MULTIMETER

FIELD OF THE INVENTION

The present invention relates to a digital, DC voltage meter device for providing a visible, digital indication of the main generator voltage and load test shunt millivoltage on a locomotive engine, which is permanently built into the locomotives voltage test panel.

BACKGROUND OF THE INVENTION

There are already known digital DC voltage meter devices for the measurement of voltages on a locomotive, all of which are hand held models. However, these devices have several important disadvantages.

One such disadvantage of previous meter models is their dependence on an external power supply in order operate the meter and obtain readings. This can be highly impracticable because in the field most locomotives operate accessories on 74 volts DC, which is not a common voltage range. Therefore, it would be highly useful to locomotive applications for the meter to be able to utilize the existing 74 volts DC power supply.

A second disadvantage of the hand held portable models relates to safety concerns. Portable units designed for measuring these voltages require the user to select voltage ranges of millivolts, for shunt volt readings (0–75 millivolt potential) and volts ×100, for the main generator voltage readings (0–1500 volt potential). Improper selection of range is very dangerous as an overload would not only destroy the meter but could also cause considerable injury to the person taking the reading.

A third disadvantage to previous digital, DC voltage meters is their inability to operate in extreme temperatures. Field temperatures can range from 20 degrees Fahrenheit below zero to 120 degrees Fahrenheit above zero.

Because these readings give a quick look at the operating performance and the possibility of potential failure of the generator, it is important that the information be readily available anytime an evaluation or running checkup is required. A permanent installation on the power plant, where the test jacks are normally located, assures immediate access to this information.

OBJECT OF THE INVENTION

The object of the present invention is to overcome these disadvantages by providing a digital, DC voltage meter device that is easily installed within the area previously dedicated for the test jacks on the locomotive being able to take crucial readings of main generator voltage and load test shunt millivolts at any time during operation. This invention operates on the 74 volts DC available from the locomotives for accessories. It utilizes a LED display for displaying voltages, which is not affected by cold weather. In addition, it is designed with safety in mind as there are no voltage range selections so that it is impossible to mistakenly be in the wrong voltage range when taking readings.

Further objects and advantages of our invention will become apparent from a consideration of the drawings and ensuing description.

SUMMARY OF THE INVENTION

According to the invention, each step of acquisition and display of voltage information comprises the following steps:

A/The acquisition of the main generator voltage from 1 to 1500 V. This is accomplished through a voltage divider circuit to reduce the voltage to a manageable level. This passes through an amplifier circuit to stabilize the signal. The signal then passes through a converter which converts this signal to digital values. The signal then passes through an analyzer circuit which performs averaging. The signal is lastly passed to the display which will display the appropriate voltage level.

B/The acquisition of the load test shunt voltage from 0 to 75 mV. This is passed through an amplifier circuit to stabilize the signal. The signal then passes through a converter which converts this signal to digital values. The signal then passes through an analyzer which performs averaging. The signal is lastly passed to the display which will display the appropriate voltage level.

C/The conversion of supplied 74 V DC is accomplished through a DC to DC converter. This provides isolation and will step the voltage down to 12 V DC. This 12 V DC is further reduced by a 5 volt regulator. The output of this regulator powers all components in the invention.

BRIEF DESCRIPTION OF THE DRAWING

Other particular features and advantages of the digital, DC voltage meter will also emerge from the following description. In the accompanying drawing given by way of non-limiting examples.

Figure 1:
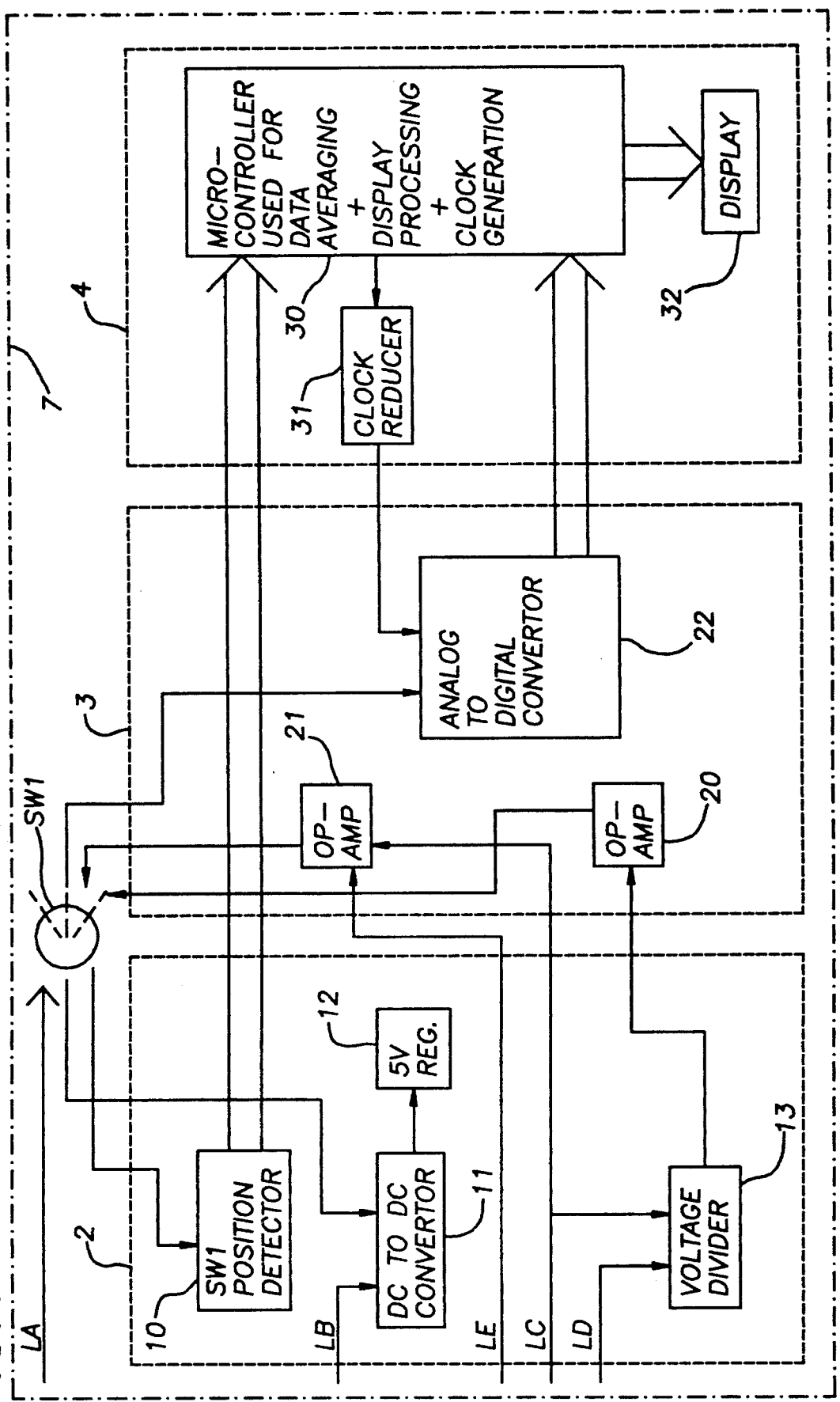
FIG. 1 is a diagrammatic general view of an energy meter according to the invention.

| LIST OF REFERENCE NUMERALS | |
|---|---|
| 1. The metering device | 20. Amplifier |
| 2. Power & Voltage Divider Panel | 21. Amplifier |
| 3. Amplifying & Analog to Digital Panel | 22. Analog to Digital Converter |
| 4. Control & Display Panel | 30. Microcontroller |
| 10. Switch Position Detector | 31. Clock Reducer |
| 11. DC to DC Converter | 32. LED Display |
| 12. 5 Volt Regulator | SW1. Power/Signal Switch |
| 13. Voltage Divider | |

DETAILED DESCRIPTION OF THE INVENTION

Referring to FIG. 1, the digital, DC voltage meter device comprises a part 2 for the reduction of higher input voltages to a workable 74 volts power supply level readable for the processing chip and utilization of a DC to DC converter; a part 3 for performance of reading, averaging and conversion of input voltages to a digital signal; a part 4 which contains the LED display; and a switch SW1 with a spring-loaded center off position.

Referring to FIG. 1, lines LE and LC represent the input voltage from the load test. LE is the negative side and LC is the positive side. These two inputs are driven directly to the amplifier 21 which is an op-amp configured with negative feedback. This will provide high input impedance and a stable signal. The output of the amplifier 21 is driven to SW1.

Lines LD and LC represent the input voltages from the main generator. LD is the negative side and LC is the positive side. LC is a common point that is provided on the locomotive. These two inputs are driven to the voltage divider 13 which is a series of resistors to reduce the voltage level and to prevent arcing within the device. The output of the voltage divider 13 is driven to the amplifier 20 which has an op-amp configured with negative feedback. This will provide high input impedance and a stable signal. The output from the amplifier 20 is driven to SW1. LB represents the negative side of the 74 V power supply used to power the device. It is driven to the DC to DC converter 11.

Part 2 for the reduction of higher input voltages to a level readable for the processing chip with utilization of a DC to DC converter, comprises a switch position detector 10; DC to DC converter 11; 5 volt regulator 12; and voltage divider 13. The switch position detector 10 is utilized to determine the position of SW1. This information is sent to the Microcontroller 30. The DC to DC converter 11 is utilized to reduce the input supply from 74 V DC to 12 V DC as well as provide isolation. The 5 volt regulator 12 is utilized to reduce 12 V DC provided from the DC to DC converter 11 to 5 V DC. This is used as a supply for all components in the meter. The voltage divider 13 divides 1–1500 V input to a low 1–200 mv level.

Part 3 for the reading, averaging and converting the input voltages to a digital signal comprises an amplifier 20 used to couple the reduced voltage level from the voltage divider 13; an amplifier 21 used to couple the voltage from inputs LE and LC (0–75 mV); and an analog to digital converter 22. The amplifier 20 provides high input impedance and prevents loading. The input signal is amplified to a level of 0–2 V DC. The amplifier 21 provides high impedance and prevents loading. The input signal is amplified to a level of 0–750 mV. The analog to digital converter 22 is used to take signals from the amplifiers 20 and 21 via SW1 and convert them to digital signals. These signals are sent to the microcontroller 30.

Part 4 which contains the LED display comprises a microcontroller 30; a clock reducer 31; and a display 32. The microcontroller 30 averages four readings from the analog to digital converter 22. The microcontroller 30 is also used to drive the clock signal to the clock reducer 31 and the drive display 32. The clock reducer 31 takes the high clock rate from the microcontroller 30 and reduces it to 125 Khz to drive the analog to digital converter 22. The display 32, which is driven by the microcontroller 30, displays the results.

SW1 is a double pull double throw switch used to control power to the meter and also to switch the appropriate signal from the amplifiers 20 or 21 to the analog to digital converter 22.

In the measurement of main generator voltage, power is fed from LA (positive side of the 74 V supply is used) directly through SW1 (which is in the top position) to the DC to DC converter 11. The DC to DC converter 11 converts and isolates this voltage down to 12 V DC. This is then driven to the 5 volt regulator 12 which drops the voltage down to 5 V DC. This will drive all components on the device. The signal is then switched from the amplifier 20 to the analog to digital converter 22. The analog to digital converter 22 is also driven from the clock reducer 31 (divide by 8 counter). This provides a clock signal critical to the sampling the analog to digital converter 22 performs. The clock reducer 31 is driven by the microcontroller 30 which outputs a fast clock signal.

The analog to digital converter 22 will convert the signal to digital signals and will drive the microcontroller 30. The microcontroller 30 will read these signals from the analog to digital converter 22 four times and perform an averaging function. The result of this calculation is then sent to the display 32 which will show the result in four digit whole numbers.

In the measurement of load test shunt millivoltage, power is fed from LA (positive side of the 74 V supply is used) directly through SW1 (when the switch is in the bottom position) to the DC to DC converter 11 and the switch position detector 10. The switch position detector 10 is an opto-isolator which will take the supply voltage and isolate it. The output of this drives the microcontroller 30. The microcontroller 30 will detect this and will display a decimal point in the third position from the left on the display 32.

The DC to DC converter 11 converts and isolates this voltage down to a 12 V DC. This is then driven to the 5 volt regulator 12 which drops the voltage down to 5 V DC. This will drive all components on the device. The signal is then switched from the amplifier 21 to the analog to digital converter 22. The analog to digital converter 22 is also driven from the clock reducer 31 (divide by 8 counter). This provides a clock signal critical to the sampling the analog to digital converter 22 performs. The clock reducer 31 is driven by the microcontroller 30 which outputs a fast clock signal.

The analog to digital converter 22 will convert the signal to digital signals and will drive the microcontroller 30. The microcontroller 30 will read these signals from the analog to digital converter 22 four times and perform an averaging function. The result of this calculation is then sent to the display 32 which will show the result in three digit whole numbers followed by a decimal point followed by 1 fractional number.

There is therefore a device for metering electrical energy on a locomotive system which is permanently installed which operates off of existing 74 volts accessory power, operates in extreme weather conditions and is safer due to the absence of manual range settings.

We claim:

1. An onboard digital locomotive multimeter to be installed on a locomotive to test a main generator voltage and a load test shunt millivoltage of a locomotive engine comprising:

a) a switching means for switching both a converter means and a regulator means, the switching means being coupled to a 74 volts power supply source, the switching means also being coupled to a converter means for converting a DC voltage, the converter means being coupled to a regulator means for regulating a voltage to provide power for the digital locomotive multimeter;

b) a first amplifier means for amplifying and coupling the load test shunt millivoltage;

c) the switching means coupled to the first amplifier means;

d) a voltage divider means for dividing a voltage, the voltage divider means being coupled to the main generator voltage;

e) a second amplifier means for amplifying and coupling a voltage, the second amplifier means being coupled to the voltage divider means and the second amplifier means also being coupled to the switching means;

f) a switch position detector means for detecting the position of the switching means, the switch position detector means being coupled to the switching means and the switch position detector means also being coupled to a microcontroller means for microprocessing;

g) an analog to digital converter means for converting an analog signal to a digital signal, the analog to digital converter means being coupled to the switching means and the analog to digital converter means also being coupled to the microcontroller means;

h) a clock reducing means for reducing a clock rate, the clock reducing means being coupled to the microcontroller means and the clock reducing means also being coupled to the analog to digital converter means; and i) a display means for displaying data, the display means coupled to the microcontroller means.

2. The invention according to claim 1 wherein the 74 volts power supply source comprises a 74 volt DC accessory power supply from the locomotive coupled to the switching means, the switching means also being coupled to the converter means which is a DC to DC converter which converts the 74 volts DC to 12 volts DC, the converter being coupled to a regulator means which is a regulator capable of reducing the 12 volts DC to 5 volts DC for providing power to the multimeter.

3. The invention according to claim 1 wherein the first and second amplifier means are amplifiers which have an op-amp configuration with negative feed back, the amplifiers also having high impedance and being able to prevent loading.

4. The invention according to claim 1 wherein the voltage divider means is a series of resistors capable of reducing a higher 1–1500 V input voltage to a lower mV level.

5. The invention according to claim 1, wherein the switching means is a double pull throw switch used to control power to the meter, and the switching means also being capable of switching an appropriate signal from the amplifiers to the analog to digital converter means.

6. The invention according to claim 1 wherein the microcontroller means is a microchip capable of data averaging, display processing and clock generation.

7. An onboard digital locomotive multimeter to be installed on a locomotive to test a main generator voltage and a load test shunt millivoltage of a locomotive engine comprising:

a) a switch coupled to a 74 volt power supply source, the switch also being coupled to a DC to DC converter, the DC to DC converter being coupled to a regulator to provide power for the digital locomotive multimeter;

b) a first amplifier coupled to the load test shunt millivoltage;

c) the switch coupled to the first amplifier;

d) a voltage divider coupled to the main generator voltage;

e) a second amplifier coupled to the voltage divider, and the second amplifier also being coupled to the switch;

f) a switch position detector coupled to the switch, the switch position detector also being coupled to a microcontroller;

g) an analog to digital converter coupled to the switch, the analog to digital converter also being coupled to a clock reducer, and the analog to digital converter being coupled to the microcontroller;

h) the clock reducer being coupled to the microcontroller and the clock reducer also being coupled to the analog to digital converter; and f) a display coupled to the microcontroller.

8. The invention according to claim 7 wherein the 74 volt power supply source comprises a 74 volt DC accessory power supply from the locomotive coupled to the switch, the switch also being coupled to the DC to DC converter which converts the 74 volt DC to 12 volts DC, the converter being coupled to a regulator which is capable of reducing the 12 volts DC to 5 volts DC for supplying power to the multimeter.

9. The invention according to claim 7 wherein the first and second amplifier have an op-amp configuration with negative feed back, the amplifiers also having high impedance and prevent loading.

10. The invention according to claim 7 wherein the voltage divider is a series of resistors capable of reducing a higher 1–1500 V input voltage to a lower mV level.

11. The invention according to claim 7 wherein the switch is a double pull throw switch used to control power to the meter, and the switch also being capable of switching an appropriate signal from the amplifiers to the analog to digital converter.

12. The invention according to claim 7 wherein the microcontroller means is a microchip capable of data averaging, display processing and clock generation.

13. A method of determining a voltage from a main generator and a shunt millivoltage from a load test on a locomotive engine and comprising the steps of:

a) providing a 74 volt DC locomotive accessory power supply to a switching means for switching to produce a switched accessory power, and converting the switched accessory power to a lowered accessory power and regulating the lowered accessory power to an usable power supply to power a multimeter;

b) amplifying and coupling the load test shunt millivoltage;

c) supplying the amplified and coupled load test shunt millivoltage to the switching means to produce a switched load test shunt millivoltage;

d) dividing the main generator voltage to produce a reduced voltage;

e) amplifying and coupling the reduced voltage to produce an amplified and coupled reduced voltage f) supplying the amplified and coupled reduced voltage to a means for switching to produce a switched reduced voltage;

g) determining the position of the switching means and supplying the determined position to a means for microprocessing;

h) supplying to a converting means for converting an analog signal to a digital signal the switched reduced voltage to produce a converted reduced voltage, and also supplying the switched load test shunt millivoltage to the converting means to produce a converted load test shunt millivoltage;

i) reducing a clock rate generated by the microprocessing means to clock rate reducing means to produce a reduced clock rate, the reduced clock rate being received by the converting means;

j) supplying to the microprocessing means the converted reduced voltage and the converted load test shunt millivoltage to produced processed data; and k) displaying the processed data.

14. The method according to claim 13 wherein the 74 volt DC accessory power supply from the locomotive is coupled to the switching means, the switching means also being coupled to a converter means which is a DC to DC converter which converts the 74 volts DC to 12 volts DC, the converter being coupled to a regulator means which is a regulator capable of reducing the 12 volts DC to 5 volts DC to supply power to the multimeter.

15. The method according to claim 13 wherein amplifying and coupling are accomplished by amplifiers which have an op-amp configuration with negative feed back, the amplifiers also having high impedance and being able to prevent loading.

16. The method according to claim 13 wherein the voltage is divided by a series of resistors capable of reducing a higher 1–1500 V input voltage to a lower mV level.

17. The method according to claim 13 wherein the microprocessing means is a microchip capable of data averaging, display processing and clock generation.

\* \* \* \* \*